(12) United States Patent
Kim et al.

(10) Patent No.: US 12,362,763 B2
(45) Date of Patent: Jul. 15, 2025

(54) ADC FOR CHARGE OUTPUT SENSORS

(71) Applicant: SKYWORKS SOLUTIONS, INC., Irvine, CA (US)

(72) Inventors: Min Gyu Kim, Portland, OR (US); Joseph Garrett Hamilton, Houston, TX (US); Timir Nandi, Santa Clara, CA (US); Barkat A. Wani, Irvine, CA (US); Praveen Kumar Venkatachala, Portland, OR (US); Wai Laing Lee, Portland, OR (US); Michael Jon Wurtz, Lake Oswego, OR (US); Humberto Campanella-Pineda, Singapore (SG)

(73) Assignee: Skyworks Solutions, Inc., Irvine, CA (US)

(*) Notice: Subject to any disclaimer, the term of this patent is extended or adjusted under 35 U.S.C. 154(b) by 83 days.

(21) Appl. No.: 18/117,375

(22) Filed: Mar. 3, 2023

(65) Prior Publication Data

US 2023/0283291 A1 Sep. 7, 2023

Related U.S. Application Data

(60) Provisional application No. 63/316,390, filed on Mar. 3, 2022, provisional application No. 63/318,587, filed on Mar. 10, 2022.

(51) Int. Cl.
*H03M 3/00* (2006.01)
*H04R 1/08* (2006.01)

(52) U.S. Cl.
CPC .......... *H03M 3/464* (2013.01); *H03M 3/338* (2013.01); *H03M 3/37* (2013.01); *H03M 3/424* (2013.01); *H03M 3/452* (2013.01); *H03M 3/454* (2013.01); *H03M 3/458* (2013.01); *H03M 3/502* (2013.01); *H04R 1/08* (2013.01); *H04R 2201/003* (2013.01)

(58) Field of Classification Search
CPC ........ H03M 3/464; H03M 3/338; H03M 3/37; H03M 3/424; H03M 3/452; H03M 3/454; H03M 3/458; H03M 3/502; H04R 1/08; H04R 2201/003
USPC .................................................. 341/118, 143
See application file for complete search history.

(56) References Cited

U.S. PATENT DOCUMENTS

| | | | | |
|---|---|---|---|---|
| 6,587,063 B1* | 7/2003 | Su | ......................... | H03M 3/446 |
| | | | | 341/143 |
| 6,980,139 B2* | 12/2005 | Doerrer | ................... | H03M 3/37 |
| | | | | 341/118 |
| 9,136,867 B2* | 9/2015 | Watanabe | ............. | H03M 3/422 |

(Continued)

*Primary Examiner* — Khai M Nguyen
(74) *Attorney, Agent, or Firm* — Chang & Hale LLP

(57) ABSTRACT

In some embodiments, an analog-to-digital converter (ADC) architecture can be implemented to process a signal from a charge output sensor. The ADC architecture can include a summing node for receiving a sensor signal from the charge output sensor, and an output node implemented to provide a digital signal representative of the sensor signal. The ADC architecture can further include a charge amplifier implemented to receive an analog signal from the summing node as an input analog signal and generate an output analog signal with a gain, and an ADC circuit implemented to generate the digital signal based on the output analog signal from the charge amplifier. The ADC architecture can further include a feedback circuit implemented between the output node and the summing node.

18 Claims, 7 Drawing Sheets

(56) References Cited

U.S. PATENT DOCUMENTS

| | | | |
|---|---|---|---|
| 10,205,465 B2* | 2/2019 | Kauffman | H03M 1/46 |
| 10,908,670 B2* | 2/2021 | Grand | G10L 25/78 |
| 11,444,635 B2* | 9/2022 | Gupta | H03M 3/452 |
| 2016/0087596 A1* | 3/2016 | Yurrtas | H04R 1/04 |
| | | | 381/111 |

* cited by examiner

ADC FOR CHARGE OUTPUT SENSORS

CROSS-REFERENCE TO RELATED APPLICATION(S)

This application claims priority to U.S. Provisional Application Nos. 63/316,390 filed Mar. 3, 2022, entitled ADC FOR CHARGE OUTPUT SENSORS, and 63/318,587 filed Mar. 10, 2022, entitled ADC FOR CHARGE OUTPUT SENSORS, the disclosure of each of which is hereby expressly incorporated by reference herein in its entirety.

BACKGROUND

Field

The present disclosure relates to analog-to-digital converters (ADCs) for charge output sensors such as micro electrical mechanical sensor (MEMS) microphones.

Description of the Related Art

A microphone is a device that senses sound and converts some or all of the sensed sound into an electrical signal. Such an electrical signal can be processed further for different applications.

In applications where an electrical signal resulting from senses sound is converted into digital information, such a conversion can be achieved utilizing an analog-to-digital converter (ADC).

SUMMARY

In accordance with some implementations, the present disclosure relates to an analog-to-digital converter (ADC) architecture for processing a signal from a charge output sensor. The ADC architecture includes a summing node for receiving a sensor signal from the charge output sensor, and an output node implemented to provide a digital signal representative of the sensor signal. The ADC architecture further includes a charge amplifier implemented to receive an analog signal from the summing node as an input analog signal and generate an output analog signal with a gain, and an ADC circuit implemented to generate the digital signal based on the output analog signal from the charge amplifier. The ADC architecture further includes a feedback circuit implemented between the output node and the summing node.

In some embodiments, the charge output sensor can be implemented as a micro electrical mechanical sensor (MEMS) device. In some embodiments, the charge output sensor can include a charge output microphone.

In some embodiments, the ADC architecture can further include an input component implemented such that the summing node is between the input component and the charge amplifier.

In some embodiments, the feedback circuit can include a feedback digital-to-analog converter (DAC) implemented to receive as an input a sample of the digital signal from the output node and provide an analog feedback signal to the summing node, such that the analog feedback signal allows an adjustment of operation of the ADC circuit.

In some embodiments, the analog feedback signal being provided to the summing node on an input side of the charge amplifier can allow processing of the sensor signal having a small amplitude with a high gain for the charge amplifier without having the ADC circuit becoming saturated.

In some embodiments, the ADC circuit can include a delta sigma modulator (DSM) ADC circuit. The DSM ADC circuit can be implemented as a continuous time DSM ADC circuit. The continuous time DSM ADC circuit can include an excess loop delay circuit configured to compensate for an excess delay in a DSM loop of the continuous time DSM ADC circuit. The excess loop delay circuit can include an excess loop delay DAC implemented to receive as an input a sample of the digital signal from the output node and provide an analog signal to an output of a summing circuit of the continuous time DSM ADC circuit.

In some embodiments, the feedback DAC can be configured as a capacitive feedback DAC. The capacitive feedback DAC can be configured to accommodate at least a capacitive coupling with the charge output sensor. The capacitive feedback DAC can be configured to also accommodate a capacitive property of a forward path including the charge amplifier.

In some embodiments, the feedback DAC can be implemented as a capacitive network of DAC elements. In some embodiments, all of the DAC elements can be configured as always-connected DAC elements. In some embodiments, the DAC elements can include a first group having always-connected DAC elements and a second group having conditionally connectable DAC elements. The always-connected DAC elements can be selected to provide lower signal levels when the sensor signal is relatively small, and the conditionally connectable DAC elements can be configured to be connected when the sensor signal is increased. The always-connected DAC elements can be connected to an input through a dynamic element matching component.

In some embodiments, the always-connected DAC elements and the conditionally connectable DAC elements can be connected to or be connectable to a thermometer DAC input.

In some embodiments, the ADC architecture can further include a DC feedback circuit implemented between the output node and an output of the charge amplifier. The DC feedback circuit can be configured to allow compensation of a DC offset resulting from operation of the ADC circuit.

In some embodiments, the DC feedback circuit can include a series arrangement of an IIR filter, a digital delta sigma modulator, and a DAC, such that an input of the IIR filter is coupled to the output node and an output of the DAC is coupled to the output of the charge amplifier. The DC feedback circuit can further include a digital gain component implemented between the output node and the IIR filter, and an attenuation component implemented between the DAC and the output of the charge amplifier. The digital component and the attenuation component can be configured to reduce in-band noise contribution from the DC feedback circuit. The digital gain component can be configured to provide a gain G, and the attenuation component can be configured to provide an attenuation by a factor of 1/G.

In some embodiments, the DC feedback circuit can further include a dynamic element matching component implemented between the digital delta sigma modulator and the DAC.

In some embodiments, the ADC architecture can further include a DC feedback circuit implemented between the output node and the summing node. The DC feedback circuit can be configured to allow compensation of a DC offset resulting from operation of the charge amplifier. The DC feedback circuit can include a series arrangement of a DAC and a low pass filter, such that an input of the DAC is coupled to the output node and an output of the low pass filter is coupled to the summing node.

In some implementations, the present disclosure relates to a packaged module that includes a packaging substrate and an analog-to-digital converter (ADC) architecture implemented on the packaging substrate and configured to process a signal from a charge output sensor. The ADC architecture includes a summing node for receiving a sensor signal from the charge output sensor, and an output node implemented to provide a digital signal representative of the sensor signal. The ADC architecture further includes a charge amplifier implemented to receive an analog signal from the summing node as an input analog signal and generate an output analog signal with a gain, and an ADC circuit implemented to generate the digital signal based on the output analog signal from the charge amplifier. The ADC architecture further includes a feedback circuit implemented between the output node and the summing node.

In some embodiments, the packaged module can further include the charge output sensor implemented on the packaging substrate.

In some embodiments, the packaged module can further include a digital signal processor configured to process the digital signal provided at the output node.

In some implementations, the present disclosure relates to an audio device that includes a charge output sensor configured to sense sound and generate a sensor signal, and an analog-to-digital converter (ADC) implemented to process the sensor signal. The ADC includes a summing node for receiving the sensor signal from the charge output sensor, and an output node implemented to provide a digital signal representative of the sensor signal. The ADC further includes a charge amplifier implemented to receive an analog signal from the summing node as an input analog signal and generate an output analog signal with a gain, and an ADC circuit implemented to generate the digital signal based on the output analog signal from the charge amplifier. The ADC further includes a feedback circuit implemented between the output node and the summing node. The audio device further includes a digital signal processor configured to process the digital signal provided at the output node.

In some implementations, the present disclosure relates to an audio device that includes a micro electrical mechanical sensor (MEMS) microphone configured to provide an output signal, and an analog-to-digital converter (ADC) configured to process the output signal of the MEMS microphone. The ADC includes a conversion circuit for converting the output signal into a digital signal, and a charge amplifier implemented to be in a feedback loop associated with the ADC.

In some implementations, the present disclosure relates to a charge analog-to-digital converter (ADC) for processing a signal from a micro electrical mechanical sensor (MEMS) sensor. The charge ADC includes a pre-amplifier integrated into a feedback loop of a delta sigma modulator to provide a reduced power consumption configuration for processing of the signal from the MEMS sensor.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In some electronic applications, a microphone having a micro electrical mechanical sensor (MEMS) device is used to sense audio signals, convert them to electrical signals and feed them to a processing circuit implemented as, for example, an application specific integrated circuit (ASIC). Such a processing circuit converts a sensed analog electrical to a digital representation for processing by an audio digital signal processor. Typically, the foregoing processing circuit includes a low gain pre-amplifier (preamp) followed by an analog to digital converter (ADC) such as a delta sigma modulator (DSM) ADC.

In most applications, MEMS output electrical audio signal is small, and thus needs to be amplified by a pre-amplifier before being fed to the ADC in the processing circuit. The processing circuit typically has a dynamic range greater than 90 dB, and the pre-amplifier plays an important role to increase the sensor output signal amplitude and utilize the dynamic range of the ADC.

Figure 1:
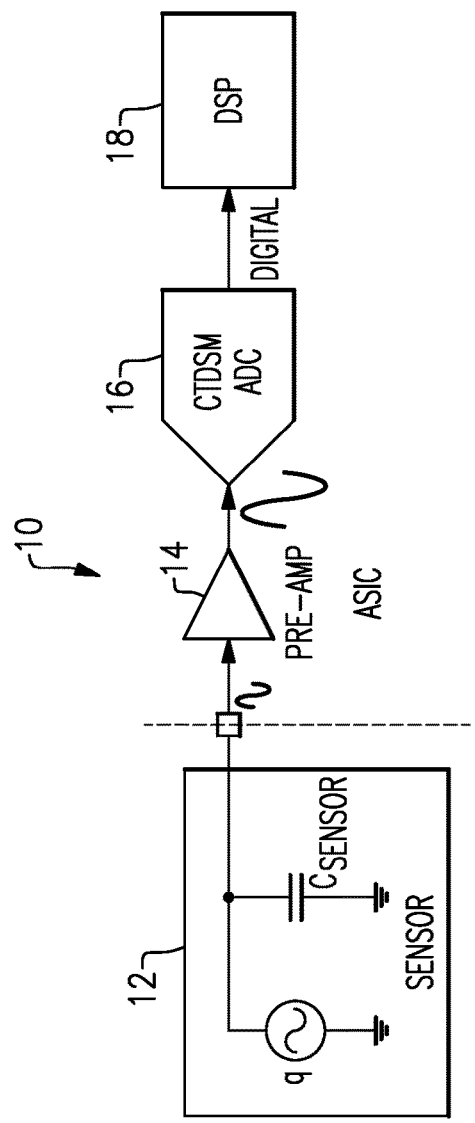
FIG. 1 shows an example of a traditional integrated circuit architecture, where a small signal from a sensor is amplified by a pre-amplifier, and the output of the pre-amplifier is provided to a discrete time (DT) or a continuous time (CT) analog-to-digital converter (ADC).

FIG. 1 shows an example of a traditional ASIC architecture 10, where a small analog signal from a sensor 12 is amplified by a pre-amplifier 14, and the analog output of the pre-amplifier 14 is provided to an ADC such as a discrete time (DT) or a continuous time (CT) DSM ADC 16. The ADC 16 is shown to provide a digital output signal representative of the analog output of the pre-amplifier 14 to a digital signal processor (DSP) 18.

It is noted that both the ADC 16 and the pre-amplifier 14 contribute noise; thus, the noise contribution of the pre-amplifier 14 should preferably be low so as to not contribute substantially to the overall noise. To achieve the foregoing low noise of the pre-amplifier 14, one can increase the transconductance of the input devices of the pre-amplifier 14, thereby consuming more power in the pre-amplifier 14.

It is also noted that increasing the gain of the pre-amplifier 14 can relax the noise requirement of the ADC 16, as the ADC noise when referred to the sensor can be reduced by a factor equal to the gain of the pre-amplifier. If possible or practical, a pre-amplifier can be configured to provide an extremely large gain, thereby reducing the noise requirement on the ADC substantially, thereby saving power. However, power supply to the pre-amplifier typically limits its maximum gain, so one typically cannot minimize the noise requirement on the ADC to a desirable extent to meet noise and power specifications.

Figure 2:
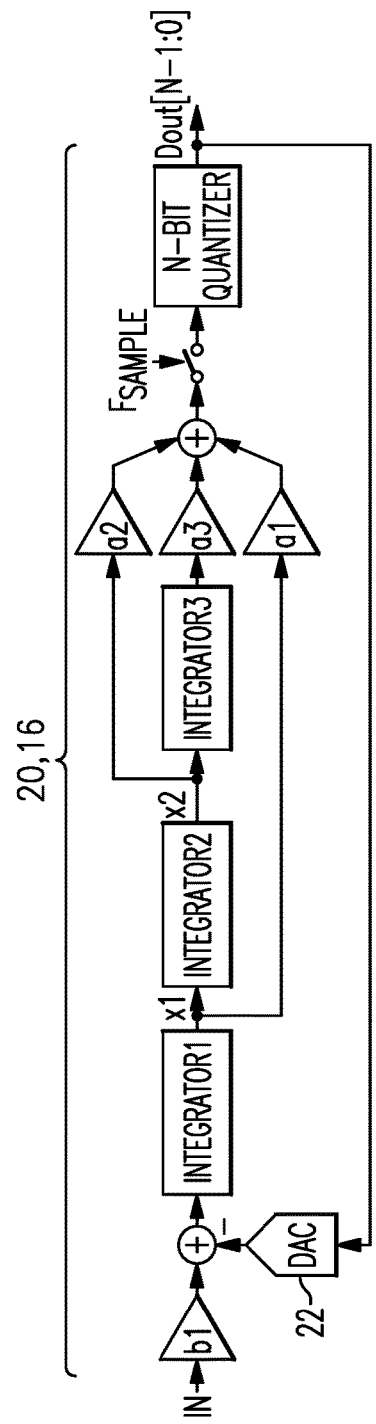
FIG. 2 shows a block diagram of a conventional third order delta-sigma modulation (DSM) ADC with a feed-forward architecture.

FIG. 2 shows a block diagram of a conventional third order DSM ADC 20, with a feed-forward architecture. Such a DSM ADC can be an example of the ADC 16 of FIG. 1.

In the example of FIG. 2, the ADC 20 is shown to include an input component b1 that receives an input analog signal ("in") (e.g., from the pre-amplifier 14 in FIG. 1). Such an analog signal is shown to be provided to an integrator (e.g., Integrators 1, 2, 3) having outputs combined by a summing circuit. The summed output is shown to be sampled into a quantizer that provides a digital output.

In the example of FIG. 2, a negative feedback loop is shown to be provided, such that the digital output of the quantizer is sampled and converted to an analog feedback signal by a digital-to-analog converter (DAC) 22. Such an analog feedback signal is shown to be combined with the input analog signal being provided to the integrator.

Referring to FIG. 2, an input to the DSM ADC 20, represented by the signal "in," can be large; but by virtue of a large loop gain of the ADC, and negative feedback, the output of the feedback DAC 22 tries to match the signal at the output of the input component b1. Therefore, the output of the subtraction block results in a substantially small signal being presented at the input of the first integrator (integrator)).

In some embodiments, an ADC can be implemented to achieve an increased gain for an input signal without saturating an amplifier with a large signal at its output. In some embodiments, such an ADC can be configured such that a pre-amplifier is implemented to be inside the ADC, as depicted in FIG. 3.

Figure 3:
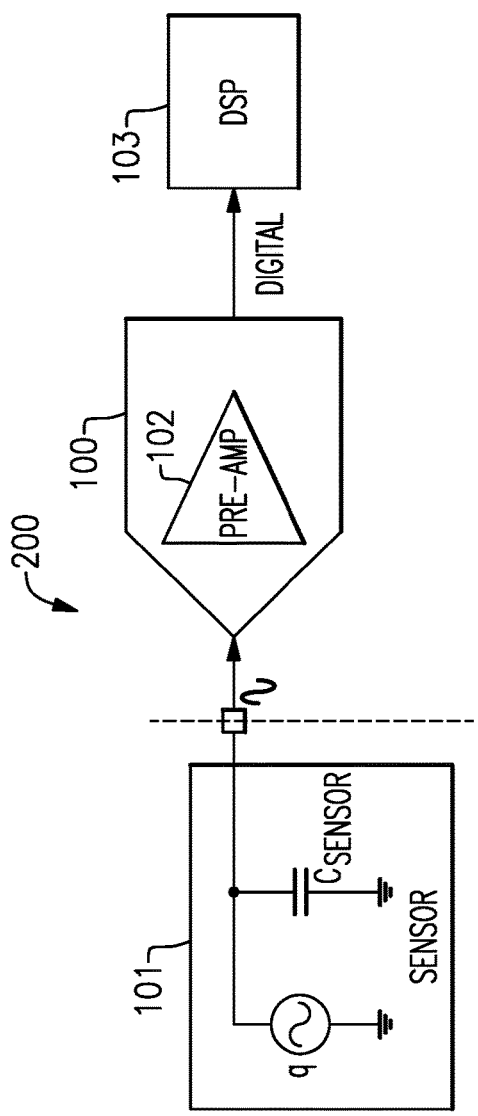
FIG. 3 shows that in some embodiments, an ADC can be implemented to include a pre-amplifier.

FIG. 3 shows that in come embodiments, an ADC 100 can include a pre-amplifier 102 implemented therein. In some embodiments, such an ADC can be implemented in a sensing architecture 200 where a small analog signal from a sensor 101 is provided to an ADC 100 having one or more features, including a pre-amplifier 102 therein, as described herein. The ADC 100 is shown to provide a digital output signal representative of the analog output of the sensor 101 to a digital signal processor (DSP) 103.

Figure 4:
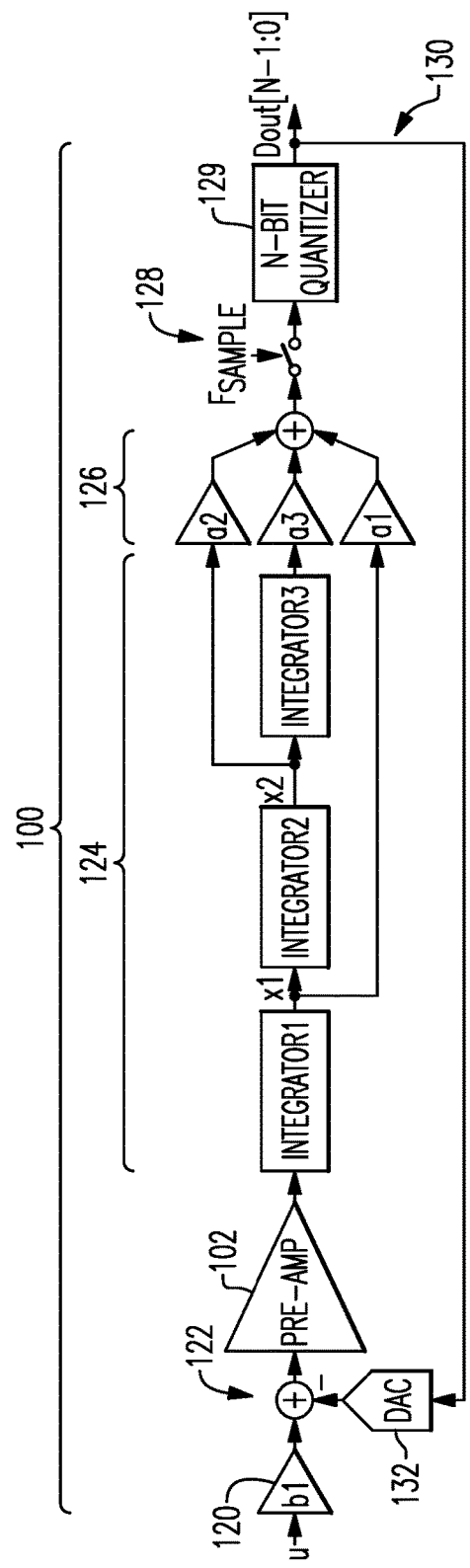
FIG. 4 shows an example of an ADC having a pre-amplifier implemented therein in an in-loop configuration.

FIG. 4 shows an ADC 100 that can be a more specific example of the ADC 100 of FIG. 3. In the example of FIG. 3, the ADC 100 is shown to include a pre-amplifier 102 implemented in an in-loop configuration. It is noted that the ADC 100 of FIG. 4 is configured as a DSM ADC; however, it will be understood that one or more features of the present disclosure can also be implemented in other types of ADCs.

In the example of FIG. 4, ADC 100 is shown to include an input component 120 (b1) that receives an analog input signal ("u") (e.g., from the sensor 101 in FIG. 3). Such an analog signal is shown to be provided to a pre-amplifier 102 through a summing node 122; and an output of the pre-amplifier 102 is shown to be provided to an integrator 124 (e.g., Integrators 1, 2, 3) having outputs combined by a summing circuit 126. The summed output is shown to be provided to a sampling circuit 128 and then to a quantizer 129 that provides a digital output.

In the example of FIG. 4, a negative feedback loop 130 is shown to be provided, such that the digital output of the quantizer 129 is sampled and converted to an analog feedback signal by a digital-to-analog converter (DAC) 132. Such an analog feedback signal is shown to be combined with the analog input signal being provided to the pre-amplifier 102 at the summing node 122.

Referring to FIG. 4, the ADC architecture 100 allows implementation of a higher gain in the pre-amplifier 102, without getting saturated, with the same power supply (as if pre-amplifier was outside the feedback loop), since the ADC 100 is processing a smaller signal. The higher gain in the pre-amplifier 102 can relax the noise requirement on the first integrator (integrator1) as its input noise will be divided by the high gain of the pre-amplifier 102. The noise of the second integrator (integrator2) is also divided by the gain of the first integrator (integrator1) and that of the pre-amplifier 102.

It is noted that the ADC architecture 100 can provide substantial power savings in the pre-amplifier 102 and ADC combination, compared to an architecture, such as in FIG. 2, where an out-of-loop pre-amplifier is followed by an ADC.

It is noted that in some embodiments, the pre-amplifier 102 may be referred to herein as a charge amplifier, since it processes signals in charge domain.

Referring to the example of FIG. 4, it is noted that the ADC 100 can be a continuous time ADC (CTDSM ADC). Thus, in such an example configuration, one can implement a technique of using an excess loop delay DAC (ELDDAC) to compensate for excess delay in the DSM loop.

Figure 5:
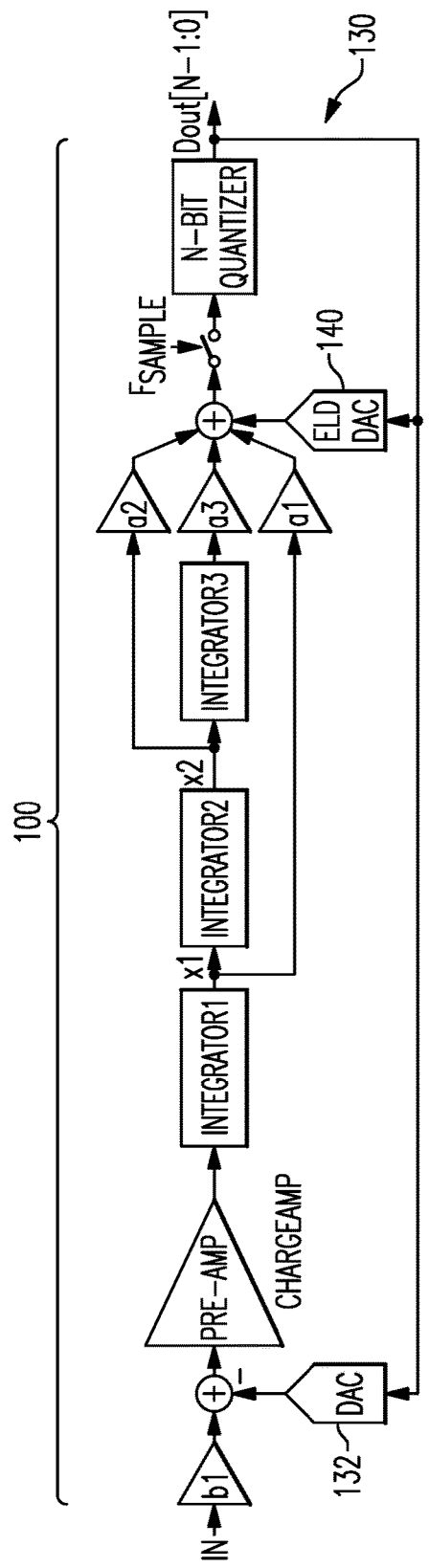
FIG. 5 shows an example where an ADC architecture similar to the ADC architecture of FIG. 4 can include an excess loop delay (ELD) digital-to-analog converter (DAC).

FIG. 5 shows that in some embodiments, an ADC architecture 100 similar to the ADC architecture 100 of FIG. 4 can include an ELDDAC 140. More particularly, a negative feedback loop 130 similar to FIG. 4 can be provided, such that the digital output of the quantizer (129 in FIG. 4) is sampled and converted to an analog feedback signal by a digital-to-analog converter (DAC) 132. Such an analog feedback signal is shown to be combined with the analog input signal being provided to the pre-amplifier (102 in FIG. 4) at the summing node (122 in FIG. 4). Additionally, the sampled digital output of the quantizer is shown to be provided to an ELDDAC 140, and the resulting output of the ELDDAC 140 is shown to be provided to a summing node of the summing circuit (126 in FIG. 4).

Referring to the examples of FIGS. 3 to 5, it is noted that the MEMS sensor (101 in FIG. 3) couples with the ADC 100 capacitively. Thus, in some embodiments, to keep the coefficient ratios in the forward and feedback paths similar, the feedback DAC 132 in the ADC 100 can be configured to be capacitive as well.

Figure 6:
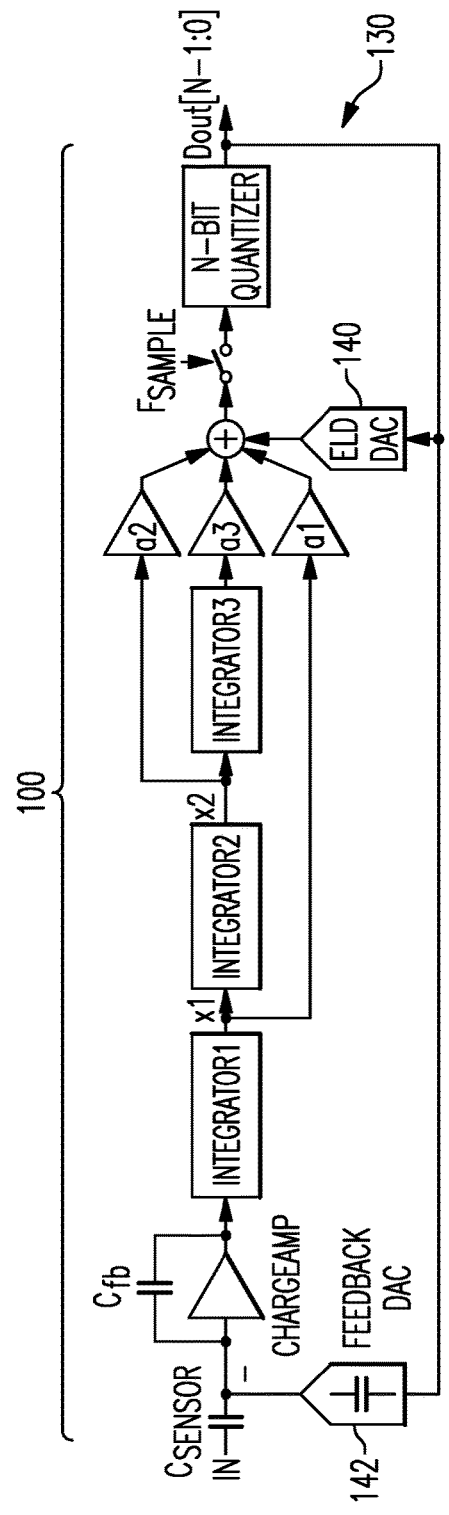
FIG. 6 shows that in some embodiments, an ADC architecture having one or more features as described herein can include a feedback DAC having capacitive response.

FIG. 6 shows an example of an ADC 100 where a feedback DAC 142 (similar to feedback DAC 132 of FIGS.

4 and 5) is configured to be capacitive. In some embodiments, such a capacitive configuration of the feedback DAC 142 can be selected to accommodate capacitive configuration of the forward path (e.g., feedback capacitance Cfb depicted across the pre-amplifier) and/or capacitive coupling (depicted as Csensor) with the MEMS sensor.

In the example of FIG. 6, the ADC architecture 100 is shown to include an ELDDAC 140 similar to the example of FIG. 5. It will be understood that the capacitive feedback DAC 142 of FIG. 6 can be implemented in an ADC architecture with or without such an ELDDAC (e.g., as in FIG. 4).

Figure 7:
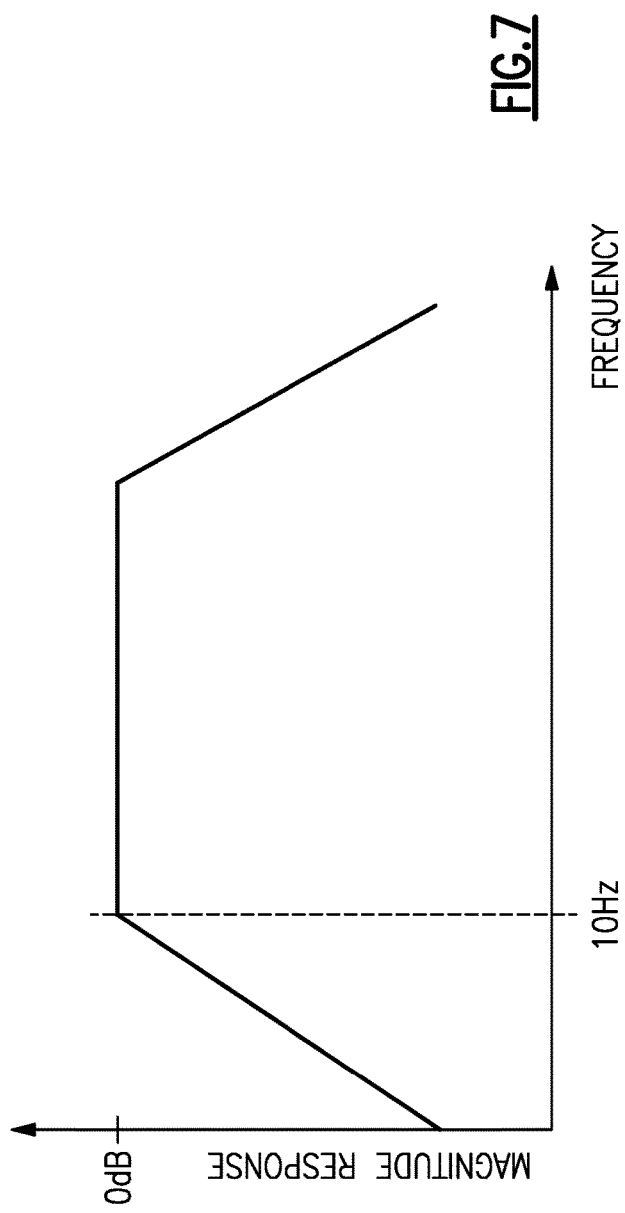
FIG. 7 shows an example of a frequency response of the ADC architecture of FIG. 6.

It is noted that capacitive feedback around the ADC 100 presents a very low frequency high pass pole. FIG. 7 shows an approximate signal path frequency response representative of the low frequency high pass pole associated with the ADC 100 of FIG. 6.

In some situations, the foregoing low frequency high pass pole can result in a lack of DC feedback around the ADC loop, and such an effect can cause accumulation of DC offsets of the integrators, resulting in a long-term drift of the integrator outputs, eventually saturating the ADC. In some embodiments, a DC feedback can be implemented as described below to address some or all of such issues.

Figure 8:
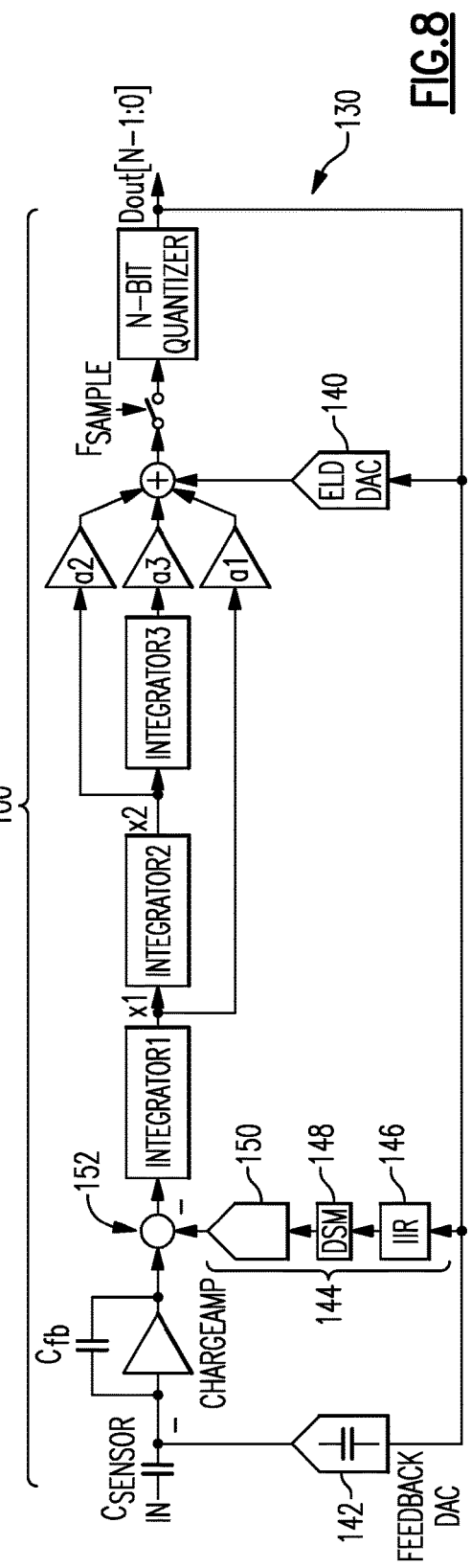
FIG. 8 shows that in some embodiments, an ADC architecture can include a DC DAC (DCDAC) feedback provided to an input of a first integrator.

For example, FIG. 8 shows that in some embodiments, a DC DAC (DCDAC) feedback 144 can be provided to the input of the first integrator (integrator1) at a node 152. In such a feedback loop, an output of the N-bit quantizer can be provided to an IIR filter 146 with a very low corner frequency. The IIR filter 146 can extract DC information from the quantizer output digital signal. The output of the IIR filter 146 can be provided to an n-bit digital delta sigma modulator (DSM) 148, which converts the DC information from the IIR filter 146 into a n-bit $2n$-level code. The n-bit DSM output can be provided to an analog DAC 150 which feeds to the input of the first integrator (integrator1) at the node 152, thus providing a DC feedback to the loop.

In the example of FIG. 8, the ADC architecture 100 is shown to include an ELDDAC 140 similar to the example of FIG. 5. It will be understood that the DC feedback of FIG. 8 can be implemented in an ADC architecture with or without such an ELDDAC (e.g., as in FIG. 4).

The example of FIG. 8, the ADC architecture 100 is shown to include a capacitive feedback DAC 142 similar to the example of FIG. 6. It will be understood that the DC feedback of FIG. 8 can be implemented in an ADC architecture where a feedback DAC may or may not be capacitive.

Figure 9:
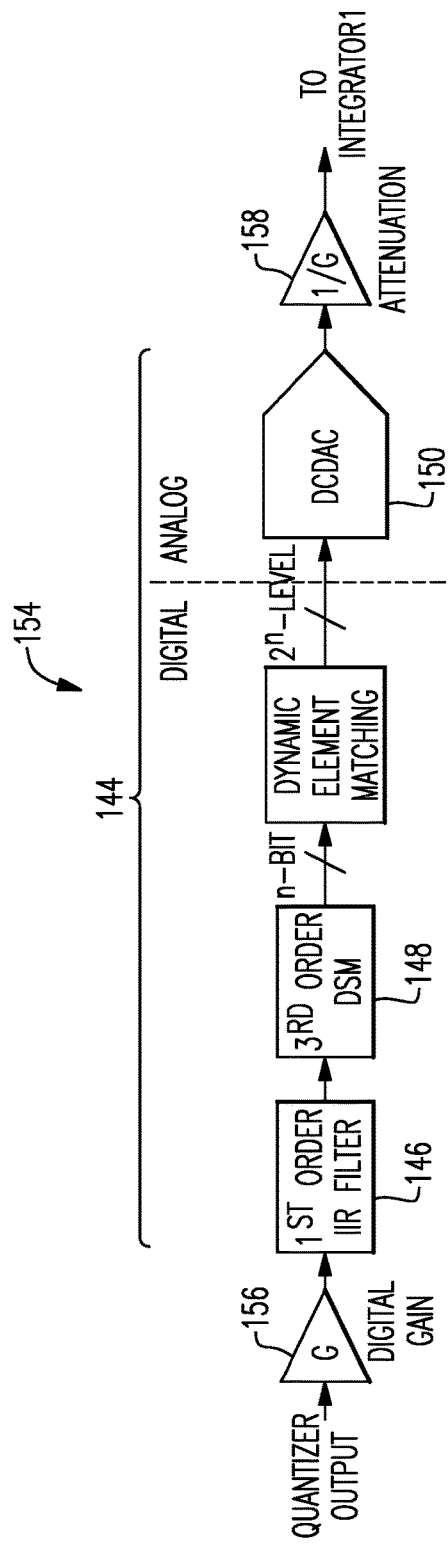
FIG. 9 shows that in some embodiments, gain can be provided in digital domain and attenuation can be provided in analog domain to reduce in-band noise in the DCDAC feedback circuit of FIG. 8.

FIG. 9 shows an example of a DCDAC feedback circuit 144 that can be implemented for the example of FIG. 8. For example, a first-order IIR filter 146 can be utilized as the IIR filter 146 of FIG. 8; a third-order DSM 148 can be utilized as the DSM 148 of FIG. 8. Additionally, a dynamic element matching component can be provided between the third-order DSM 148 and the DCDAC 150.

FIG. 9 further shows that in some embodiments, a feedback configuration 154 can be implemented with the DCDAC feedback circuit 144 to reduce in-band noise contribution from the DCDAC. For example, one can provide gain (G) 156 between the quantizer output and the IIR filter 146 in the digital domain and provide attenuation (1/G) 158 after the analog DCDAC 150.

Figure 10:
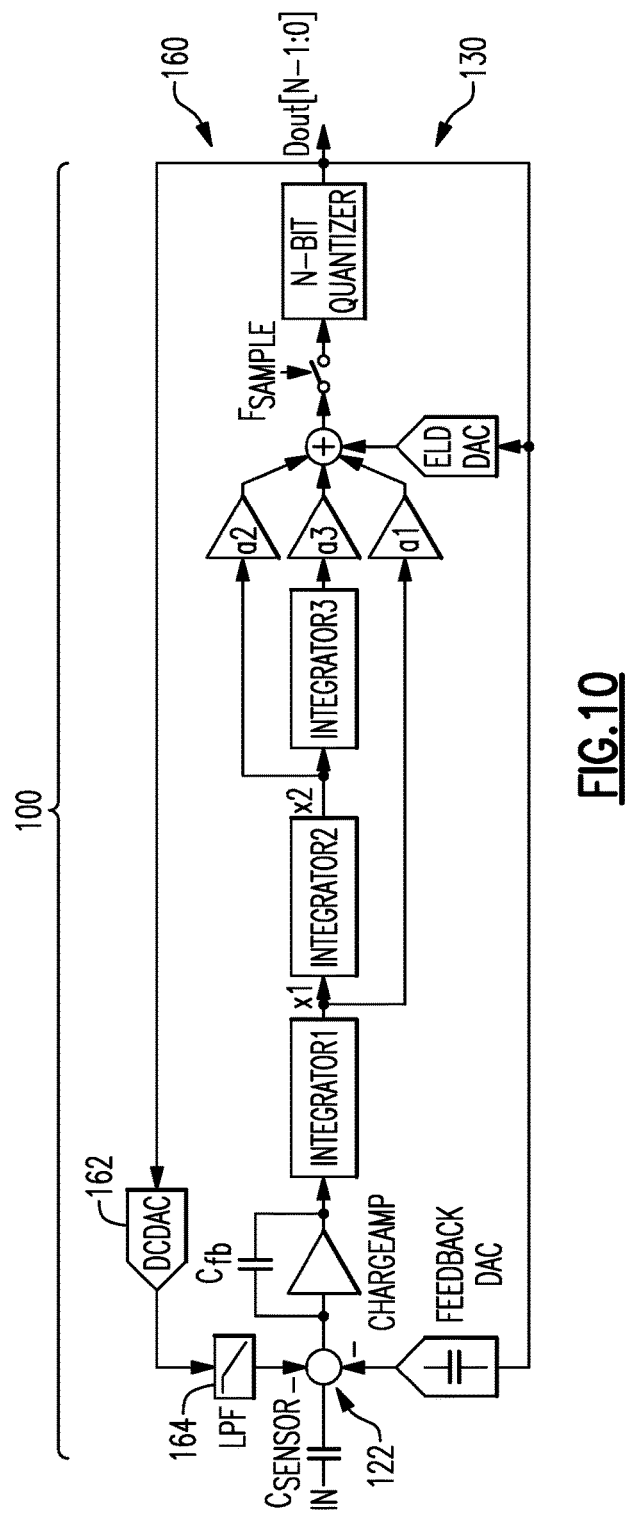
FIG. 10 shows that in some embodiments, an ADC architecture having one or more features as described herein can include a DC feedback to an input of a charge amplifier.

FIG. 10 shows that in some embodiments, DC feedback can be provided to an input of the charge amp. More particularly, an ADC architecture 100 can include a feedback circuit 160, such that the digital output of the quantizer (129 in FIG. 4) is sampled and converted to an analog feedback signal by a DCDAC 162. Such an analog feedback signal is shown to be provided to the summing node 122 through a low pass filter (LPF) 164 such as a first-order LPF.

For such a DC feedback configuration of FIG. 10, where an output of the quantizer is converted to an analog signal by the DCDAC 162 and provided to the summing node 122 through the first-order LPF 164 having a very low corner frequency, DC information from the output of the ADC can be obtained. In some embodiments, such DC information can be provided to the input of the charge amp, thus providing DC feedback around the loop.

It is noted that in some embodiments, the feedback circuit 160 of FIG. 10 can be implemented in any of the example ADC architectures of FIGS. 4 to 9.

It is noted that in many audio applications, a substantial reduction in the power required for a digital microphone is a desirable performance metric for MEMS microphones.

Typically, MEMS microphones do not require much, if any, gain because at maximum sound pressure level (SPL) the signal is large for a low voltage MEMS. This low or unity gain property is highly desirable since the input noise requirements for microphone ASICs are reduced which results in lower power being consumed to obtain low noise.

A typical conventional solution utilizes a buffer or perhaps a non-inverting amplifier with modest gain. Since the gain is low, ADC input noise requirements are not reduced relative to the first stage, thus the following stage also has input noise requirements similar to the first stage and thus similar input transistor current and power to meet the noise figure requirements for the microphone system. Accordingly, such an ADC typically includes larger capacitors that consume more power and area.

As described herein, an ADC can include a charge amplifier that can be utilized with a capacitive sensor. The charge amplifier produces an output voltage proportional to the charge input. A charge ADC produces a digital word proportional to the charge input.

It is noted that charge amplifiers can have a disadvantage at low gains because they have a noise gain of K+1, compared to K for non-inverting topologies such as in a typical high impedance buffer used in conventional MEMS microphones. For example, if K is low, this is a power disadvantage. For K=1, charge amplifiers have a 6 dB power disadvantage.

However, there are a number of advantageous features associated with charge amplifiers. For example, a charge amplifier is an inverting architecture, so the input voltage swing is very small and does not require as much common-mode rejection as a non-inverting amplifier. In another example, parasitic capacitance does not attenuate the output unlike voltage buffer approach as the charge amplifier input is typically at a very low impedance. In yet another example, a charge amplifier can have a gain less than 1 whereas in high impedance buffers, minimum gain is 1.

As described herein, an ADC can include a first stage high gain charge amplifier driving the ADC input (e.g., directly driving the ADC input) with capacitively coupled global charge feedback derived from the ADC output to reduce the system gain while still maintaining some or all of the advantages in noise and power from having a high first stage gain. Such a global loop can be closed by charge pulses from a capacitive DAC to the charge amplifier input, thereby reducing the system gain.

In some embodiments, to close the loop, charge feedback is required or desired; however, for small signal levels, the charge feedback can be delivered with relatively small amounts of global feedback capacitance, thus maintaining a low noise gain for small signals. At higher levels, to deliver much more charge, larger capacitances (e.g., capacitors) can be utilized, which can raise the noise gain and thus noise floor, but only for large signals where the need for low noise is typically not required. As a result, the noise can remain low until input signal levels require more charge than what the smallest global feedback capacitance can provide, since the amount of voltage that can be used to put charge on the capacitance is limited. When such an effect occurs, larger or more capacitances can be used to meet the feedback charge requirements.

It is noted that in some embodiments, a notable advantage provided by use of charge amplifiers can include providing high gain for small signal thereby reducing the power requirements for later stages, and the noise floor gradually increasing with signal level as the signal approaches full scale digital output. The integration of the charge-amplifier-ADC-loop can remain low gain from a signal transfer function aspect while still maintaining an advantage of a high first stage gain to reduce the noise floor requirements for later stages. This reduces the analog power required to meet noise requirements by approximately 6 dB, which in some applications, is a four-fold reduction compared to a conventional approach utilizing cascaded voltage buffer before an ADC.

It is also noted that one or more features of the present disclosure can include an additional property that is unlike other techniques that use a voltage amplifier, in that in some embodiments, the maximum signal level that can be handled by an ADC architecture as described herein is limited only by the amount of CDAC feedback capacitance.

In some embodiments, an ADC architecture having one or more features as described herein can be advantageous for a number of reasons. For example, lower power consumption can be achieved because of the high first stage gain (when the signal is small); thus following stages require less power. In another example, a charge amplifier as described herein can short the sensor; thus, the sensor does not voltage clip as in voltage amplifier approaches. In yet another example, a maximum signal level can be only limited by the amount of feedback capacitance of the CDAC, unlike in voltage approaches that have increasing voltage headroom requirements.

In some embodiments, a feedback DAC as described herein can be implemented as a segmented DAC array. For example, in some embodiments, a feedback DAC 142 in the ADC architecture 100 of FIG. 6 can be implemented as a thermometric capacitive DAC, formed with $2^N-1$ elements, where N is the resolution of the quantizer. As the quantizer processes a signal and provides an output code for a changing input signal, capacitive elements from such a feedback DAC can be connected to a virtual ground at the charge amplifier (ChargeAmp) input to provide a feedback matching the input signal. It is noted that for MEMS applications, target signal to noise ratio (SNR) at small signal levels is more stringent. One can utilize a selected number of DAC elements at low signal level that are always connected to the virtual ground of the charge amplifier. These DAC elements can be switched to either a reference voltage or to ground depending on the input code provided from the quantizer.

Figure 11:
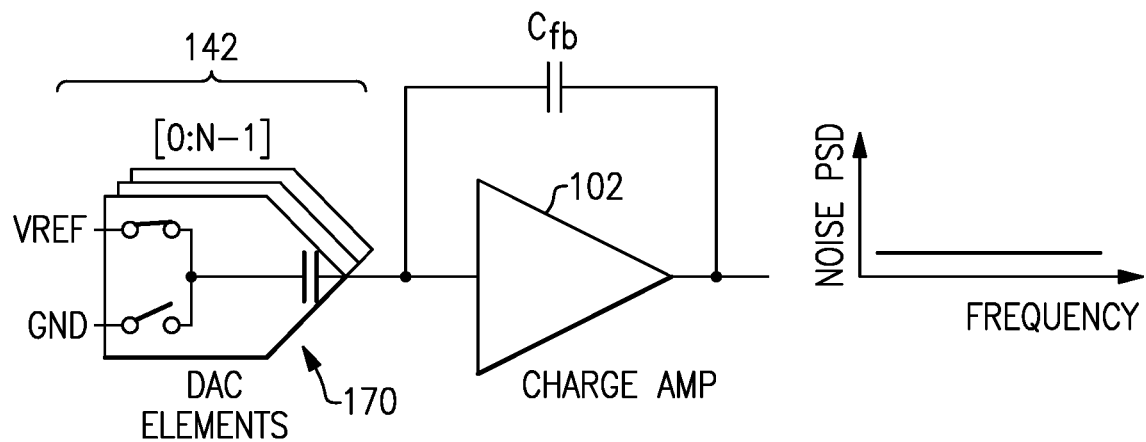
FIG. 11 shows that in some embodiments, a feedback DAC as described herein can be implemented as a segmented DAC array.

FIG. 11 shows an example of a capacitive network of DAC elements 170 that can form a feedback DAC 142 such as the feedback DAC of FIG. 6. In FIG. 11, such DAC elements 170 are shown to be connected to the input of the charge amplifier 102 (Charge Amp). It is noted that such a configuration adds kT/C noise having a white spectrum, compared to other switched capacitor networks that can result in the kT/C noise having a pink spectrum.

It is noted that the DAC elements 170 of FIG. 11 always being connected can result in loading the charge amplifier 102 (Charge Amp), reducing the feedback factor of the charge amplifier 102 and thereby increasing its noise gain.

Figure 12:
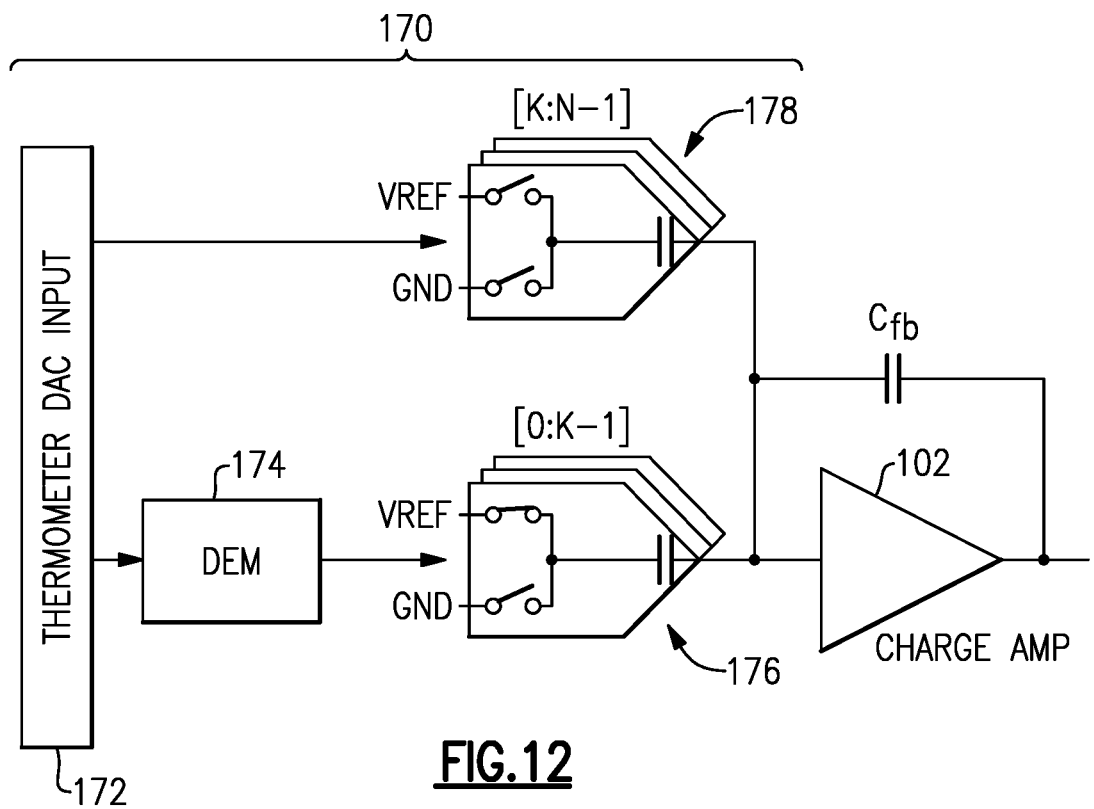
FIG. 12 shows that in some embodiments, a feedback DAC having DAC array elements can be configured to provide a selected number of always-connected elements and the remaining elements being conditionally connectable elements.

FIG. 12 shows that in some embodiments, a feedback DAC having N DAC array elements 170 can be configured to provide a selected number of always-connected elements 176 (e.g., elements [0:K−1]) and the remaining elements being conditionally connectable elements 178 (e.g., elements [K:N−1]). Configured in the foregoing manner, the always-connected elements 176 [0:K−1] can be connected to a virtual ground at lower signal levels, thereby limiting the noise added. As input signal amplitude is increased, the feedback DAC elements 178 [K:N−1] (that are unconnected at the lower signal levels) can be connected to the virtual ground.

In some embodiments, the conditionally connectable elements [K:N−1] are not reset when disconnected, and can be left floating.

FIG. 12 shows that in some embodiments, a thermometer DAC input 172 is shown to provide inputs to the always-connected elements 176 and the conditionally connectable elements 178. For the always-connected elements 176, such an input signal can be provided with dynamic element matching (DEM) 174 applied to a limited range which is same as or less than the always-connected element range.

It is note that the feedback DAC configuration 170 of FIG. 12 can provide a number of desirable features. For example, lower loading on the charge amplifier 102 can be achieved at lower signal levels; thus, lower noise gain in the charge amplifier can be achieved at such lower signal levels. In another example, DEM switching power can be reduced by limiting DEM range to the always-connected segment 176. In yet another example, one can maximize or improve the SNR and SNDR for the small signal levels in certain applications by reducing noise gain and DEM range limiting functionality.

Figure 13:
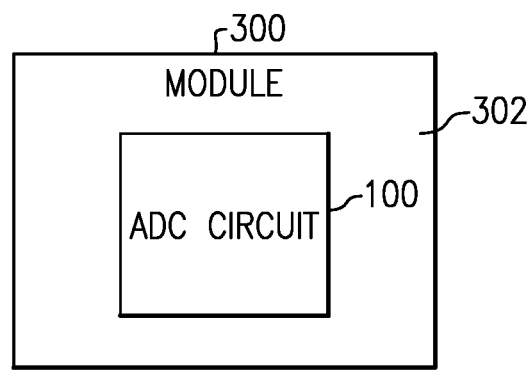
FIG. 13 shows that in some embodiments, a module can include an ADC circuit having one or more features as described herein.
Figure 14:
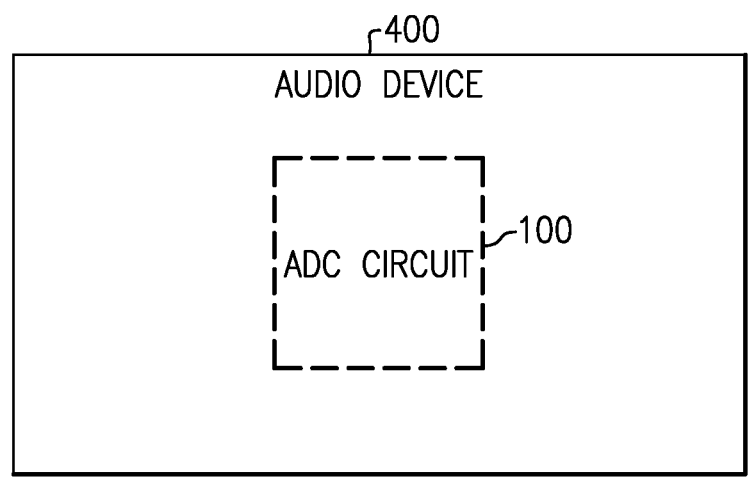
FIG. 14 shows that in some embodiments, an audio device can include an ADC circuit having one or more features as described herein.

FIGS. 13 and 14 show examples of various products where one or more features of the present disclosure can be implemented. For example, FIG. 13 shows that in some embodiments, a module 300 having a packaging substrate 302 can include an ADC circuit 100 having one or more features as described herein. In some embodiments, the module 300 of FIG. 13 can include a MEMS sensor such as the sensor 101 of FIG. 3. In some embodiments, the module 300 of FIG. 13 can include a digital signal processor such as the DSP 103 of FIG. 3. In some embodiments, the module 300 of FIG. 13 can include a MEMS sensor such as the sensor 101 of FIG. 3, and a digital signal processor such as the DSP 103 of FIG. 3.

In another example, FIG. 14 shows that in some embodiments, an audio device 400 can include an ADC circuit 100 having one or more features as described herein. In some embodiments, the device 400 of FIG. 14 can also include some or all of a MEMS sensor such as a MEMS microphone, a digital signal processor such as a digital audio signal processor, a power source, a speaker, and a controller. In some embodiments, the device 400 of FIG. 14 can be a wireless device, a wired device, or some combination thereof.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure.

The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An analog-to-digital converter (ADC) architecture for processing a signal from a charge output sensor, the ADC architecture comprising:
   a summing node for receiving a sensor signal from the charge output sensor;
   an output node implemented to provide a digital signal representative of the sensor signal;
   a charge amplifier implemented to receive an analog signal from the summing node as an input analog signal and generate an output analog signal with a gain;
   an ADC circuit implemented to generate the digital signal based on the output analog signal from the charge amplifier;
   a feedback circuit implemented between the output node and the summing node, the feedback circuit including a feedback digital-to-analog converter (DAC) implemented to receive as an input a sample of the digital signal from the output node and provide an analog feedback signal to the summing node, such that the analog feedback signal allows an adjustment of operation of the ADC circuit; and
   a DC feedback circuit implemented between the output node and an output of the charge amplifier, the DC feedback circuit configured to allow compensation of a DC offset resulting from operation of the ADC circuit, the DC feedback circuit including a series arrangement of an IIR filter, a digital delta sigma modulator, and a DAC, such that an input of the IIR filter is coupled to the output node and an output of the DAC is coupled to the output of the charge amplifier.

2. The ADC architecture of claim 1 wherein the charge output sensor is implemented as a micro electrical mechanical sensor (MEMS) device.

3. The ADC architecture of claim 1 wherein the charge output sensor includes a charge output microphone.

4. The ADC architecture of claim 1 further comprising an input component implemented such that the summing node is between the input component and the charge amplifier.

5. The ADC architecture of claim 1 wherein the analog feedback signal being provided to the summing node on an input side of the charge amplifier allows processing of the sensor signal having a small amplitude with a high gain for the charge amplifier without having the ADC circuit becoming saturated.

6. The ADC architecture of claim 1 wherein the ADC circuit includes a delta sigma modulator (DSM) ADC circuit.

7. The ADC architecture of claim 6 wherein the DSM ADC circuit is implemented as a continuous time DSM ADC circuit.

8. The ADC architecture of claim 7 wherein the continuous time DSM ADC circuit includes an excess loop delay circuit configured to compensate for an excess delay in a DSM loop of the continuous time DSM ADC circuit.

9. The ADC architecture of claim 8 wherein the excess loop delay circuit includes an excess loop delay DAC implemented to receive as an input a sample of the digital signal from the output node and provide an analog signal to an output of a summing circuit of the continuous time DSM ADC circuit.

10. The ADC architecture of claim 1 wherein the feedback DAC is configured as a capacitive feedback DAC.

11. The ADC architecture of claim 10 wherein the capacitive feedback DAC is configured to accommodate at least a capacitive coupling with the charge output sensor.

12. The ADC architecture of claim 11 wherein the capacitive feedback DAC is configured to also accommodate a capacitive property of a forward path including the charge amplifier.

13. The ADC architecture of claim 10 wherein the feedback DAC is implemented as a capacitive network of DAC elements.

14. The ADC architecture of claim 13 wherein all of the DAC elements are configured as always-connected DAC elements.

15. The ADC architecture of claim 13 wherein the DAC elements include a first group having always-connected DAC elements and a second group having conditionally connectable DAC elements.

16. The ADC architecture of claim 1 further comprising a DC feedback circuit implemented between the output node and the summing node, the DC feedback circuit configured to allow compensation of a DC offset resulting from operation of the charge amplifier.

17. An audio device comprising:
   a charge output sensor configured to sense sound and generate a sensor signal;
   an analog-to-digital converter (ADC) implemented to process the sensor signal, the ADC including a summing node for receiving the sensor signal from the charge output sensor, and an output node implemented to provide a digital signal representative of the sensor signal, the ADC further including a charge amplifier implemented to receive an analog signal from the summing node as an input analog signal and generate an output analog signal with a gain, and an ADC circuit implemented to generate the digital signal based on the output analog signal from the charge amplifier, the ADC further including a feedback circuit implemented between the output node and the summing node, the feedback circuit including a feedback digital-to-analog converter (DAC) implemented to receive as an input a sample of the digital signal from the output node and provide an analog feedback signal to the summing node, such that the analog feedback signal allows an adjustment of operation of the ADC circuit, the ADC further including a DC feedback circuit implemented between the output node and an output of the charge amplifier, the DC feedback circuit configured to allow compensation of a DC offset resulting from operation of the ADC circuit, the DC feedback circuit including a series arrangement of an IIR filter, a digital delta sigma modulator, and a DAC, such that an input of the IIR filter is coupled to the output node and an output of the DAC is coupled to the output of the charge amplifier; and
   a digital signal processor configured to process the digital signal provided at the output node.

18. An audio device comprising:

a micro electrical mechanical sensor (MEMS) microphone configured to provide an output signal; and an analog-to-digital converter (ADC) configured to process the output signal of the MEMS microphone, the ADC including a conversion circuit for converting the output signal into a digital signal, the ADC further including a charge amplifier and a first feedback circuit between an output of the ADC and an input of the charge amplifier, the first feedback circuit including a feedback digital-to-analog converter (DAC) implemented to receive as an input a sample of the digital signal from the output node and provide an analog feedback signal to the input of the charge amplifier, such that the analog feedback signal allows an adjustment of operation of the conversion circuit, the ADC further including a second feedback circuit implemented between the output of the ADC and an output of the charge amplifier, the second feedback circuit configured to allow compensation of a DC offset resulting from operation of the conversion circuit, the second feedback circuit including a series arrangement of an IIR filter, a digital delta sigma modulator, and a DAC, such that an input of the IIR filter is coupled to the output of the ADC and an output of the DAC is coupled to the output of the charge amplifier.

* * * * *